United States Patent [19]

Kanemasa et al.

[11] 4,215,415
[45] Jul. 29, 1980

[54] RECURSIVE DIGITAL FILTER COMPRISING A CIRCUIT RESPONSIVE TO FIRST SUM AND FEEDBACK SIGN BITS AND SECOND SUM SIGN AND INTEGER BITS FOR DETECTING OVERFLOW IN THE SECOND SUM

[75] Inventors: Akira Kanemasa; Hisashi Sakaguchi, both of Tokyo, Japan

[73] Assignee: Nippon Electric Company, Ltd., Tokyo, Japan

[21] Appl. No.: 943,836

[22] Filed: Sep. 19, 1978

[30] Foreign Application Priority Data

Sep. 19, 1977 [JP] Japan .................................. 52-113097
Sep. 22, 1977 [JP] Japan .................................. 52-114845

[51] Int. Cl.$^2$ ......................... G06F 15/34; G06F 7/48
[52] U.S. Cl. ..................................... 364/724; 364/745
[58] Field of Search ................................. 364/724, 745

[56] References Cited

U.S. PATENT DOCUMENTS

| | | | |
|---|---|---|---|
| 3,700,874 | 10/1972 | Heightley | 364/724 X |
| 3,725,687 | 4/1973 | Heightley | 364/724 |
| 4,034,197 | 7/1977 | Lawrence et al. | 364/724 |

OTHER PUBLICATIONS

S. L. Freeny, "Special-Purpose Hardware for Digital Filtering," *Proceedings of the IEEE*, vol. 63, No. 4, Apr. 1975, pp. 633-647.
Y. Chu, *Digital Computer Design Fundamentals*, ©1962 by McGraw-Hill Book Co., pp. 1-13.
A. Peled et al., *Digital Signal Processing Theory, Design, and Implementation*, ©1976 by John Wiley & Sons, pp. 286-289.

Primary Examiner—Jerry Smith
Attorney, Agent, or Firm—Sughrue, Rothwell, Mion, Zinn and Macpeak

[57] ABSTRACT

In a recursive digital filter for dealing with data words given by two's complement representation in a common word format comprising a sign bit, an integer bit, and a predetermined number of fractional bits, an overflow detect and correct circuit is supplied with simultaneously produced sign bits of bit-serial first sum, feedback, and second sum data words and with the integer bit of the second sum data word and detects overflow in the second sum data word to produce, for use in the circuit, an overflow detect pulse indicative of presence or absence of overflow. In either event, the circuit produces an overflow-free data word for use in the filter. When overflow is detected, the circuit produces a polarity decision pulse that decides polarities of the overflow-free bits. Otherwise, the circuit determines the overflow-free bits directly by the corresponding bits of the second sum data word. Use is preferred of a first and a second timing signal which specify time slots for the sign bit and a prescribed bit, respectively, of each serial data words and which are for directly deciding the overflow-free fractional bits by the polarity decision pulse and for producing a second polarity decision pulse for direct decision of polarities of the overflow-free sign and integer bits. A memory having a plurality of memory areas is preferred for production of the overflow detect and the polarity decision pulses and of the overflow-free bits.

9 Claims, 17 Drawing Figures

FIG 3

| TIMING | $x_1$ | $y_1$ | $z_1$ | $z_2$ | $d_i = Z_n$ | $OF_1$ | $S_1$ | $D_1 = v_n$ | REMARKS |
|---|---|---|---|---|---|---|---|---|---|
| $T_1 = "1"$ | 0 | 0 | 0 | 0 | 0 | 0 | 0/1 | 0 | NO OVERFLOW |
| | 0 | 0 | 0 | 0 | 1 | 0 | 0/1 | 1 | |
| | 0 | 1 | 0 | 0 | 0 | 0 | 0/1 | 0 | |
| | 0 | 1 | 0 | 0 | 1 | 0 | 0/1 | 1 | |
| | 1 | 0 | 0 | 0 | 0 | 0 | 0/1 | 0 | |
| | 1 | 0 | 0 | 0 | 1 | 0 | 0/1 | 1 | |
| | 0 | 1 | 1 | 1 | 0 | 0 | 0/1 | 0 | |
| | 0 | 1 | 1 | 1 | 1 | 0 | 0/1 | 1 | |
| | 1 | 0 | 1 | 1 | 0 | 0 | 0/1 | 0 | |
| | 1 | 0 | 1 | 1 | 1 | 0 | 0/1 | 1 | |
| | 1 | 1 | 1 | 1 | 0 | 0 | 0/1 | 0 | |
| | 1 | 1 | 1 | 1 | 1 | 0 | 0/1 | 1 | |
| | 0 | 0 | 0 | 1 | 0 | 1 | 0 | 1 | POSITIVE OVERFLOW (1st RANGE) |
| | 0 | 0 | 0 | 1 | 1 | 1 | 0 | 1 | |
| | 0 | 1 | 0 | 1 | 0 | 1 | 0 | 1 | |
| | 0 | 1 | 0 | 1 | 1 | 1 | 0 | 1 | |
| | 1 | 0 | 0 | 1 | 0 | 1 | 0 | 1 | |
| | 1 | 0 | 0 | 1 | 1 | 1 | 0 | 1 | |
| | 0 | 0 | 1 | 0 | 0 | 1 | 0 | 1 | POSITIVE OVERFLOW (2nd RANGE) |
| | 0 | 0 | 1 | 0 | 1 | 1 | 0 | 1 | |
| | 0 | 0 | 1 | 1 | 0 | 1 | 0 | 1 | |
| | 0 | 0 | 1 | 1 | 1 | 1 | 0 | 1 | |
| | 0 | 1 | 1 | 0 | 0 | 1 | 1 | 0 | NEGATIVE OVERFLOW (1st RANGE) |
| | 0 | 1 | 1 | 0 | 1 | 1 | 1 | 0 | |
| | 1 | 0 | 1 | 0 | 0 | 1 | 1 | 0 | |
| | 1 | 0 | 1 | 0 | 1 | 1 | 1 | 0 | |
| | 1 | 1 | 1 | 0 | 0 | 1 | 1 | 0 | |
| | 1 | 1 | 1 | 0 | 1 | 1 | 1 | 0 | |
| | 1 | 1 | 0 | 0 | 0 | 1 | 1 | 0 | NEGATIVE OVERFLOW (2nd RANGE) |
| | 1 | 1 | 0 | 0 | 1 | 1 | 1 | 0 | |
| | 1 | 1 | 0 | 1 | 0 | 1 | 1 | 0 | |
| | 1 | 1 | 0 | 1 | 1 | 1 | 1 | 0 | |

FIG 4

| TIMING | $OF_1'$ $S_1'$ / $OF_2'$ $S_2'$ / $OF_3'$ $S_3'$ | $d_i$ | $OF_2$ $S_2$ | $D_2$ | REMARKS |
|---|---|---|---|---|---|
| $T_1 = "0"$, $T_2 = "0"$ | 0 0/1 | 0 | 0 0/1 | 0 | NO OVERFLOW |
| | 0 0/1 | 1 | 0 0/1 | 1 | |
| | 1 0 | 0 | 1 0 | 1 | POSITIVE OVERFLOW |
| | 1 0 | 1 | 1 0 | 1 | |
| | 1 1 | 0 | 1 1 | 0 | NEGATIVE OVERFLOW |
| | 1 1 | 1 | 1 1 | 0 | |

FIG 5

| TIMING | $OF_2'$ $S_2'$ | $d_i = Z_2$ | $OF_3$ $S_3$ | $D_3 = S_3$ | REMARKS |
|---|---|---|---|---|---|
| $T_2 = "1"$ | 0 0/1 | 0 | 0 1/0 | 0 | NO OVERFLOW |
| | 0 0/1 | 1 | 0 1/0 | 1 | |
| | 1 0 | 0 | 1 1 | 0 | POSITIVE OVERFLOW |
| | 1 0 | 1 | 1 1 | 0 | |
| | 1 1 | 0 | 1 0 | 1 | NEGATIVE OVERFLOW |
| | 1 1 | 1 | 1 0 | 1 | |

FIG 8

| TIMING | $x_1$ | $y_1$ | $z_1$ | $z_2$ | $OF_1$ | $S_1$ | REMARKS |
|---|---|---|---|---|---|---|---|
| $T_1="1"$ | 0 | 0 | 0 | 0 | 0 | 0/1 | NO OVERFLOW |
| | 0 | 1 | 0 | 0 | 0 | 0/1 | |
| | 1 | 0 | 0 | 0 | 0 | 0/1 | |
| | 0 | 1 | 1 | 1 | 0 | 0/1 | |
| | 1 | 0 | 1 | 1 | 0 | 0/1 | |
| | 1 | 1 | 1 | 1 | 0 | 0/1 | |
| | 0 | 0 | 0 | 1 | 1 | 1 | POSITIVE OVERFLOW (1st RANGE) |
| | 0 | 1 | 0 | 1 | 1 | 1 | |
| | 1 | 0 | 0 | 1 | 1 | 1 | |
| | 0 | 0 | 1 | 0 | 1 | 1 | POSITIVE OVERFLOW (2nd RANGE) |
| | 0 | 0 | 1 | 1 | 1 | 1 | |
| | 0 | 1 | 1 | 0 | 1 | 0 | NEGATIVE OVERFLOW (1st RANGE) |
| | 1 | 0 | 1 | 0 | 1 | 0 | |
| | 1 | 1 | 1 | 0 | 1 | 0 | |
| | 1 | 1 | 0 | 0 | 1 | 0 | NEGATIVE OVERFLOW (2nd RANGE) |
| | 1 | 1 | 0 | 1 | 1 | 0 | |

| TIMING | $OF_1'$ $S_1'$ / $OF_2'$ $S_2'$ / $OF_3'$ $S_3'$ | $OF_2$ | $S_2$ | REMARKS |
|---|---|---|---|---|
| $T_1="0"$, $T_2="0"$ | 0  0/1 | 0 | 0/1 | NO OVERFLOW |
| | 1  1 | 1 | 1 | POSITIVE OVERFLOW |
| | 1  0 | 1 | 0 | NEGATIVE OVERFLOW |

| TIMING | $OF_2'$ $S_2'$ | $OF_3$ | $S_3'$ | REMARKS |
|---|---|---|---|---|
| $T_2="1"$ | 0  0/1 | 0 | 1/0 | NO OVERFLOW |
| | 1  1 | 1 | 1 | POSITIVE OVERFLOW |
| | 1  0 | 1 | 1 | NEGATIVE OVERFLOW |

| TIMING | $x_1$ | $y_1$ | $z_1$ | $z_2$ | $OF_1$ | $S_1$ | REMARKS |
|---|---|---|---|---|---|---|---|
| $T_1="1"$ | 0 | 0 | 0 | 0 | 0 | 0/1 | NO OVERFLOW |
| | 0 | 1 | 0 | 0 | 0 | 0/1 | |
| | 1 | 0 | 0 | 0 | 0 | 0/1 | |
| | 0 | 1 | 1 | 1 | 0 | 0/1 | |
| | 1 | 0 | 1 | 1 | 0 | 0/1 | |
| | 1 | 1 | 1 | 1 | 0 | 0/1 | |
| | 0 | 0 | 0 | 1 | 1 | 0 | POSITIVE OVERFLOW (1st RANGE) |
| | 0 | 1 | 0 | 1 | 1 | 0 | |
| | 1 | 0 | 0 | 1 | 1 | 0 | |
| | 0 | 0 | 1 | 0 | 1 | 0 | POSITIVE OVERFLOW (2nd RANGE) |
| | 0 | 0 | 1 | 1 | 1 | 0 | |
| | 0 | 1 | 1 | 0 | 1 | 1 | NEGATIVE OVERFLOW (1st RANGE) |
| | 1 | 0 | 1 | 0 | 1 | 1 | |
| | 1 | 1 | 1 | 0 | 1 | 1 | |
| | 1 | 1 | 0 | 0 | 1 | 1 | NEGATIVE OVERFLOW (2nd RANGE) |
| | 1 | 1 | 0 | 1 | 1 | 1 | |

| TIMING | OF₁' S₁'<br>OF₂' S₂' | $d_i$ | OF₂ S₂ | D₂ | REMARKS |
|---|---|---|---|---|---|
| $T_1 = $ "0"<br>$T_2 = $ "0" | 0  0/1<br>0  0/1<br>1  0<br>1  0<br>1  1<br>1  1 | 0<br>1<br>0<br>1<br>0<br>1 | 0  0/1<br>0  0/1<br>1  0<br>1  1<br>1  0<br>1  1 | 0<br>1<br>1<br>0<br>0<br>0 | NO OVERFLOW<br>POSITIVE OVERFLOW —72<br>NEGATIVE OVERFLOW |

FIG 15

| TIMING | OF₂' S₂' | $d_i = z_2$ | OF₃ S₃ | $D_3 = v_2$ | REMARKS |
|---|---|---|---|---|---|
| $T_2 = $ "1" | 0  0/1<br>0  0/1<br>1  0<br>1  0<br>1  1<br>1  1 | 0<br>1<br>0<br>1<br>0<br>1 | 0  0/1<br>0  0/1<br>1  1<br>1  1<br>1  0<br>1  0 | 0<br>1<br>0<br>0<br>1<br>1 | NO OVERFLOW<br>POSITIVE OVERFLOW —73<br>NEGATIVE OVERFLOW |

FIG 16

| TIMING | OF₃' S₃' | $d_i = z_1$ | $D_4 = v_1$ | REMARKS |
|---|---|---|---|---|
| $T_1 = $ "1" | 0  0/1<br>0  0/1<br>1  1<br>1  1<br>1  0<br>1  0 | 0<br>1<br>0<br>1<br>0<br>1 | 0<br>1<br>0<br>0<br>1<br>1 | NO OVERFLOW<br>POSITIVE OVERFLOW —74<br>NEGATIVE OVERFLOW |

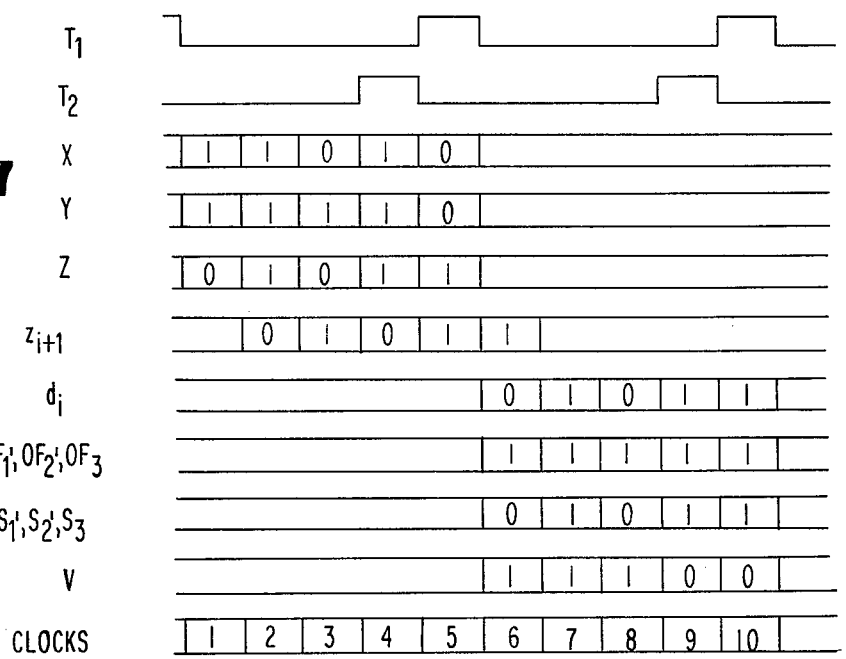

FIG 17

RECURSIVE DIGITAL FILTER COMPRISING A CIRCUIT RESPONSIVE TO FIRST SUM AND FEEDBACK SIGN BITS AND SECOND SUM SIGN AND INTEGER BITS FOR DETECTING OVERFLOW IN THE SECOND SUM

BACKGROUND OF THE INVENTION:

This invention relates to a digital filter of a recursive type.

A digital filter comprises digital circuit elements, such as a shift register, a digital multiplier, and a digital adder, and has an excellent frequency characteristic as compared with an analog filter. Inasmuch as the digital circuit elements are readily realized by an integrated circuit, it is possible to render a digital filter compct and inexpensive.

For application to such a digital filter, an analog signal is converted to an input digital signal by sampling the analog signal at a sampling interval or period into analog samples and encoding each analog sample at a clock period or bit interval into a sequence of binary pulses. An input digital signal thus comprises successive input data words, each consisting of binary pulses of a predetermined number of bits or a fixed word length. The digital filter subjects each input data word to a digital operation defined by a filter characteristic to produce an output data word.

Digital filters are broadly classified into those of a recursive and a non-recursive type according as the filter comprises a feedback loop and does not, respectively. A typical non-recursive digital filter is described in U.S. Pat. No. 3,521,041 issued to Richard van Blerkom et al. A non-recursive digital filter is advantageous in that the absence of a feedback loop never results in oscillation due to overflow which will be discussed in detail hereunder. It is, however, difficult with a non-recursive digital filter to implement a desired filter characteristic. On the other hand, a recursive digital filter is exemplified as a recursive second-order filter section in FIG. 2 of an article contributed by Stanley L. Freeny to "Proceedings of the IEEE," Volume 63, No. 4 (April, 1975), pages 633–648, under the title of "Special-Purpose Hardware for Digital Filtering." The recursive second-order filter section is important in practice because it is possible to achieve various filter characteristics by cascading or paralleling such sections as pointed out in the Freeny article with reference to FIGS. 3 and 4 thereof. It should, however, be borne in mind that overflow results from an adder accompanying a feedback path. The overflow gives rise to oscillations, known as limit cycles in the art, to adversely affect the filtering function. A circuit for detecting and correcting the overflow is therefore indispensable. An overflow detection or detect and correction or correct circuit is described in the Freeny article with reference to FIGS. 6 and 18 thereof. As seen from the detail shown in this FIG. 18, the prior art circuit comprises a considerable number of circuit elements and is complicated in structure. This has inevitably rendered the recursive digital filters inexpensive.

SUMMARY OF THE INVENTION:

It is therefore an object of the present invention to provide a recursive digital filter comprising an overflow detect and correct circuit that is simple in structure.

It is another object of this invention to provide an economical recursive digital filter of the type described.

In general, a recursive digital filter comprises a first adder responsive to each of input data words and a first feedback data word for producing a first sum data word, a second adder responsive to the first sum data word and a second feedback data word for producing a second sum data word, an overflow detect and correct circuit for detecting overflow in the second sum data word and producing a first of overflow-free data words by correcting, when overflow is detected, the detected overflow, a first and a second feedback device responsive to a second of the overflow-free data words for producing the first and the second feedback data words, respectively, and means responsive to all overflow-free data words for producing output data words. All of the data words are given by two's complement representation in a common word format comprising a sign bit, an integer bit, and a predetermined number of fractional bits. Each of all data words thus has corresponding bits in others of all data words. The first adder, the second feedback device, and the second adder substantially simultaneously produce the corresponding bits of the respective ones of the first sum, the second feedback, and the second sum data words in bit series. In accordance with this invention, the overflow detect and correct circuit comprises first means responsive to the sign bits of the first sum, the second feedback, and the second sum data words and the integer bit of the second sum data word for producing an overflow detect pulse indicative of presence and absence of the overflow and a first polarity decision pulse indicative, at least when the overflow detect pulse indicates presence of overflow, of polarities of the sign, the integer, and the fractional bits of the first overflow-free data word, second means responsive to the overflow detect and the first polarity decision pulse for producing, only when the overflow detect pulse indicates presence of overflow, the sign, the integer, and the fractional bits of the first overflow-free data word with polarities decided by the first polarity decision pulse, and third means responsive to the overflow detect pulse and the second sum data word for producing, only when the overflow detect pulse indicates absence of overflow, the sign, the integer, and the fractional bits of the first overflow-free data word with polarities determined by the corresponding bits of the second sum data word.

A second polarity decision pulse is preferably used in the second means for directly deciding the polarities of the sign and the integer bits of the first overflow-free data word, with the first polarity decision pulse used to directly decide the polarities of the fractional bits of the first overflow-free data word.

BRIEF DESCRIPTION OF THE DRAWING

FIG. 3 shows a first memory area of a read-only memory comprised by the circuit depicted in FIG. 2;

FIG. 4 shows a second memory area of the above-mentioned read-only memory;

FIG. 5 shows a third memory area of the above-mentioned read-only memory;

FIG. 8 shows a first memory area of a read-only memory comprised by the circuit illustrated in FIG. 7;

FIG. 9 shows a second memory area of the last-mentioned read-only memory;

FIG. 10 shows a third memory area of the last-mentioned read-only memory;

FIG. 13 shows a first memory area of a read-only memory comprised by the circuit shown in FIG. 12;

FIG. 14 shows a second memory area of the read-only memory mentioned in connection with FIG. 13;

FIG. 15 shows a third memory area of the read-only memory mentioned in conjunction with FIG. 13;

FIG. 16 shows a fourth memory area of the read-only memory described in connection with FIG. 13; and FIG. 17 is a schematic time chart for describing operation of the circuit illustrated in FIGS. 12 through 16.

Figure 1:
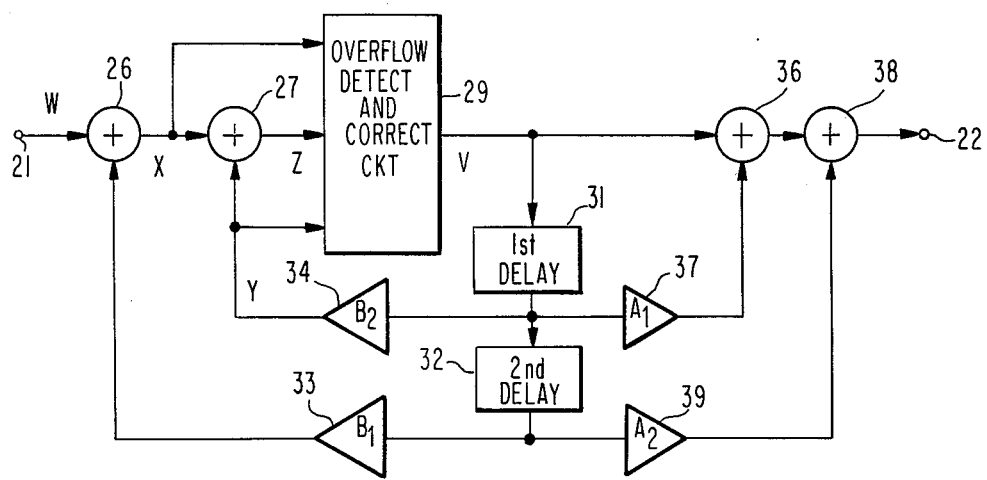
FIG. 1 is a block diagram of a recursive digital filter to which the instant invention is applicable.

DESCRIPTION OF THE PREFERRED EMBODIMENTS:

Referring to FIG. 1, a recursive digital filter according to the present invention comprises filter input and output terminals 21 and 22. The input terminal 21 is successively supplied with filter input data words W derived from an original analog signal as described in the preamble of the instant specification. A first adder 26 is supplied with each input data word W from the input terminal 21 and with a first feedback data word to produce a first sum data word X representative of a sum of the input data word W and the feedback data word. A second adder 27 is supplied with the first sum data word X and a second feedback data word Y to produce a second sum data word Z. It is possible now to assume without loss of generality that each input data word W is for a decimal number between minus one, inclusive, and plus one, exclusive, namely:

$$-1 \leqq W < 1,$$

with the data words, such as W, X, Y, and Z, used throughout the digital filter given by signed two's complement representation. As will become clear as the description proceeds, the first feedback data word is generally between minus one and plus one, both exclusive. The second feedback data word Y is generally greater than minus two and less than plus two. The first sum data word X is therefore less than two in absolute value. It is therefore possible to give the data words W, X, and Y with a common fixed-point and fixed-length word format comprising a polarity or sign bit, an integral part of a single integer bit, and a decimal part of a plurality of fractional bits in general, n bits in total, where n represents an integer equal at least to three. It is readily understood that the number given by such a data word is allowed to take a value between minus two, inclusive, and plus two, exclusive. The sum of the first sum data word X and the second feedback data word Y, however, is less than four in absolute value. The sum, which may be named a true sum data word U, may thus take a value which lies outside the allowed set of values. This is overflow in the true sum data word U and is undesirable from viewpoints of filter design and operation. Consequently, the true sum data word U, which have (n+1) bits with two integer bits assigned to the integral part, is not actually used and is not shown in the drawing. Instead, use is made of the second sum data word Z that again has the specified word format. It may be presumed here again without loss of generality that the polarity bit is used as the most significant digit of each data word. When overflow occurs in the true sum data word U, the most significant bit of the integer part is put in the polarity bit of the second sum data word Z with the polarity bit of the true sum data word U omitted. This is overflow in the second sum data word Z, although the definition of overflow is somewhat modified in the following.

Further referring to FIG. 1, an overflow detect and correct circuit 29 is for detecting overflow, if any, in the second sum data word Z and correcting the detected overflow according to a prescribed rule exemplified hereunder to produce an overflow-free data word V. When overflow is not detected, the second sum data word Z is produced as the overflow-free data word V. The overflow-free data word V is modified into the first feedback data word by a first feedback path or device and to the second feedback data word Y by a second feedback path or device. The first feedback path comprises a first delay element 31 for producing a first delayed data word by giving a predetermined delay to the overflow-free data word V, a second delay element 32 for producing a second delayed data word by giving a preselected delay to the first delayed data word, and a first multiplier 33 for producing the first feedback data word by multiplying the second delayed data word by a first factor $B_1$. The second feedback path comprises the first delay element 31 and a second multiplier 34 for producing the second feedback data word Y by multiplying the first delayed data word by a second factor $B_2$. It should be noted that a combination of the delay elements 31 and 32 may be called a first delay element and the first delay element 31 alone, a second delay element, and that the factors $B_1$ and $B_2$ are used herein for recursive coefficients represented usually by $\beta_2$ and $\beta_1$, respectively, in the art. The overflow-free data word V is supplied also to a third adder 36 together with a first feed-forward data word that is produced by a first feed-forward path or device comprising the first delay element 31 and a third multiplier 37 for producing the feed-forward data word by multiplying the first delayed data word by a third factor $A_1$. The third adder 36 supplies a third sum data word to a fourth adder 38 to which a second feed-forward data word is also supplied through a second feed-forward path or device comprising the first and the second delay elements 31 and 32 and a fourth multiplier 39 for producing the second feed-forward data word by multiplying the second delayed data word by a fourth factor $A_2$. The fourth adder 38 supplies a fourth sum data word to the filter output terminal 22 as a filter output data word. The third and the fourth adders 36 and 38, the delay elements 31 and 32 used also in the feedback paths, and the third and the fourth multipliers 37 and 39 serve as means responsive to the overflow-free data word V for producing the filter output data word.

In the recursive digital filter shown in FIG. 1, the first through the fourth factors $B_1$, $B_2$, $A_1$, and $A_2$ are given those values which are selected to provide the filter with a desired filter characteristic. Among the four factors, the first and the second factors $B_1$ and $B_2$ are selected so that:

$$-1 < B_1 < 1 \text{ and}$$

$$-2 < B_2 < 2,$$

in order to stabilize the filter operation as described by Abraham Peled et al in a book "Digital Signal Processing: Theory, Design, and Implementation" published 1976 by John Wiley & Sons, Inc., with reference to FIG. 6.12 on page 287. It is now understood that the overflow-free data word V should represent a decimal number between minus one, inclusive, and plus one, exclusive. This is in order that overflow may not occur in the first sum data word X. The true sum data word U is therefore said to have overflowed when the decimal value the word U represents is less than minus one and equal to or greater than plus one. In any event, how to select the four factors has no direct concern with the subject matter of this invention and will not be described any further. If desired, details of the filter design in this respect should be understood by reference to the Freeny article or to the Peled et al book. As regards the details of a binary code given by two's complement representation, reference may be had to a book "Digital Computer Design Fundamentals" written by Yaohan Chu and published 1962 by McGraw-Hill Book Company, Inc., pages 10–13. Incidentally, the data words W or the like supplied to or actually produced by the circuit elements of the recursive digital filter are separated from one another by a control signal known in the art. The adders 26, 27, 36, and 38, the multipliers 33, 34, 37, and 39, and the overflow detect and correct circuit 29 are timed by a sequence of clock pulses defining successive clock periods. Each clock period or a bit interval is equal to 1/n of the sampling interval. It is possible to number from one to n the clock periods for the polarity bit, the integer bit, and the fractional bit or bits, respectively. Although the fractional bits are thus denumerable in the order of the digits, this is not mandatory. The control signal is produced as by counting down the clock pules. When the number n of bits of each data word is five, the clock frequency is 40 kHz for a sampling frequency of 8 kHz. A clock generator for the clock pulse sequence, a frequency divider for the control signal, and connections for the control signal and the clock pulse sequence are not depicted in the drawing merely for simplicity of illustration.

The principles will now be described, based on which overflow in the second sum data word Z is detected by the overflow detect and correct circuit 29. Throughout the following, it is presumed that the data words actually used in the digital filter have a five-bit word length when a particular number of bits is given by way of example and that the positive and the negative signs are represented by binary "0" and "1" values, respectively. The polarity bit will be enclosed by a pair of parentheses for convenience of understanding. The decimal point will be represented also for an easier understanding, although unnecessary in operation of the digital filter.

As described hereinabove, overflow is said to have occurred in the second sum data word Z when the true sum data word U is in a range between minus four and minus one, exclusive, or in another range between plus one, inclusive, and plus four. These ranges of the overflow are classified into two ranges:

a first range: $-2 \geq U < -1$ or $1 \geq U < 2$; and
a second range: $-4 < U < -2$ or $2 \geq U < 4$.

To speak of the second range at first, the overflow occurs only when the first sum data word X and the second feedback data word Y have the same sign. Two's complement representations of the numbers in the second range are (1)00.001, (1)00.010, ..., (1)00.111, (1)01.000, ..., and (1)01.111 or (0)10.000, (0)10.001, ..., (0)10.111, (0)11.000, ..., and (0)11.111. The second sum data words Z for these values are (0)0.001, (0)0.010, ..., (0)0.111, (0)1.000, ..., and (0)1.111 or (1)0.000, (1)0.001, ..., (1)0.111, (1)1.000, ..., and (1)1.111. It is now understood that the overflow for the second range is detected by the facts that the polarity bits of the first sum data word X and the second feedback data word Y are of the same binary value or polarity and that the polarity bit of the second sum data word Z is of a polarity different from the common polarity of the polarity bits of the first sum and the second feedback data words X and Y. It is also understood that the polarity bit of the overflow-free data word V should be given the common polarity, namely, a polarity opposite to the polarity of the polarity bit of the second sum data word Z. Two's complement representations of the numbers in the first range are (1)10,000, (1)10.001, ..., and (1)10.111 or (0)01.000, (0)01.001, ..., and (0)0.1.111. The second sum data words Z for the second range are therefore (1)0.000, (1)0.001, ..., and (1)0.111 or (0)1.000, (0)1.001, ..., and (0)1.111. On the other hand, two's complement representations of the true sum data word U in the absence of overflow are (1)11.000, (1)11.001, ..., (1)11.111, (0)00.000, ..., and (0)00.111. The second sum data words Z are given under the circumstances by (1)1.000, (1)1.001, ..., (1)1.111, (0)0.000, ..., and (0)0.111. The overflow for the first range is detected by the fact that the polarity and the integer bits of the second sum data word Z represents binary values different from each other, although the fact may appear also in the second range of the overflow. It is also understood that the polarity bit of the overflow-free data word V is given by the polarity bit of the second sum data word Z unless the polarity bit of the first sum and the second feedback data words X and Y are of a common binary value and are different from the binary value of the polarity bit of the second sum data word Z.

For example, let a second sum data word Z be "(0)1.010" in signed two's complement representation. The data word Z gives either 1.250 or minus 2.750 in decimal representation. In both cases, overflow is detected by the polarity and the integer bits of different binary values. When the polarity bits of the first sum and the second feedback data words X and Y are of binary "1" value, the polarity bit of the overflow-free data word V should be given binary "1" value. Otherwise, the polarity bit of the latter word V should be given binary "0" value. As another example, let a second sum data word Z be "(1)1.101." The data word Z represents either 3.625 or minus 0.375. Overflow is absent if at least one of the polarity bits of the first sum and the second feedback data words X and Y is binary "1." If both polarity bits of the latter words X and Y are binary "0," overflow is detected. Inasmuch as the polarity bit of the second sum data word Z is binary "1," the polarity bit of the overflow-free data word V is binary "0" in the latter event.

For convenience of further description, overflow will be called positive and negative when the true sum data word U is positive and negative, respectively. The overflow-free data word V is given a maximum absolute value of the allowed set of values. For example, the overflow-free data word V is given binary "(0)0.111" or decimal 0.875 and binary "(1)1.000" or minus one in decimal representation when overflow is positive and negative, respectively. Furthermore, it is surmised for simplicity of circuitry of the overflow detect and correct circuit 29 that the input data word W is supplied to the filter input terminal 21 in bit series from the least significant digit to the most significant digit, namely, from the least significant bit among the fractional bits to the polarity bit. The corresponding bits, such as the polarity bits, of the respective data words X, Y, and Z are supplied substantially simultaneously to the overflow detect and correct circuit 29.

Figure 2:
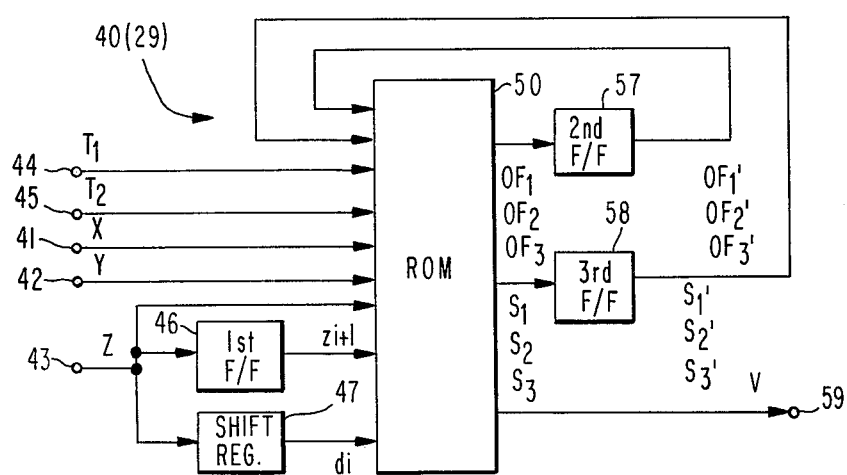
FIG. 2 is a block diagram of an overflow detect and correct circuit for use in a recursive digital filter according to a first embodiment of this invention.

Referring now to FIG. 2, an overflow detect and correct circuit 40 is for use as the overflow detect and correct circuit 29 in a recursive digital filter according to a first embodiment of this invention and comprises five circuit input terminals, namely, first through third data word input terminals 41, 42, and 43 for the first sum data word X, the second feedback data word Y, and the second sum data word Z, respectively, a first timing input terminal 44 for a first timing signal $T_1$ that takes binary "1" value in coincidence with simultaneous application of the polarity bits of the respective data words X, Y, and Z to the data word input terminals 41 through 43, respectively, and is otherwise given binary "0" value, namely, that specifies the clock period for the polarity bit of each of the bit-serial data words X, Y, and Z, and a second timing input terminal 45 for a second timing signal $T_2$ that is rendered binary "1" in coincidence with simultaneous application to the data word input terminals 41 through 43 of the most significant bit among the fractional bits of the respective data words X, Y, and Z and otherwise given binary "0" value. The respective bits of each data word will be numbered i (i being representative of 1, 2, . . . , and n) from the most significant digit, namely, the polarity bit. Thus: the first sum data word X has a polarity bit $x_1$; the second feedback data word Y, a polarity bit $y_1$; the second sum data word Z, a polarity bit $z_1$, an integer bit $z_2$, and a decimal part consisting of its most significant bit $z_3$, . . . , its least significant bit but one $z_{n-1}$, and its least significant bit $z_n$; and the overflow-free data word V, a polarity bit $v_1$, an integer bit $v_2$, and fractional bits $v_3$, . . . , $V_{n-1}$, and $v_n$. The numbering from the polarity bits is for simplicity of notation. It should be noted, when the clock periods are numbered from the first to the n-th in time sequential order from the clock period in which the data word input terminals 41 through 43 are simultaneously supplied with the least significant digits, such as $z_n$, of the data words under consideration, that the data input terminals 41 through 43 are supplied with the polarity bits $x_1$, $y_1$, and $z_1$ in the n-th clock period, the integer bits, such as $z_2$, in the (n−1)-th clock period, and the least significant digits, such as $z_n$, in the first clock period. The first and the second timing signals $T_1$ and $T_2$ are thus turned to binary "1" in the n-th clock period of each sampling interval and in the (n−2)-th clock period of the next following sampling period, respectively, irrespective of actual application to the data input terminals 41 through 43 of next following data words X, Y, and Z.

Further referring to FIG. 2, a first flip-flop 46 receives the second sum data word Z from the third data word input terminal 43 and responds to every bit $z_i$ of the data word Z to successively produce one-bit delayed pulses. When a particular bit $z_i$ is supplied to the third data word input terminal 43 in a particular clock period, the one-bit delayed pulse produced in the particular clock period represents a next less significant bit $z_{i+1}$ supplied to the third data word input terminal 43 in a next preceding clock period. The one-bit delayed pulse is therefore designated by $z_{i+1}$. A shift register 47 is supplied with the second sum data word Z also from the third data word input terminal 43 and is loaded with (n−1) bits, such as the least significant bit but one $z_{n-1}$ through the polarity bit $z_1$. The shift register 47 thus produces (n−1)-bit delayed pulses $z_{i+(n-1)}$ designated herein by $d_i$ for simplicity. A read-only memory 50 is supplied with the data words X, Y, and Z, the first and the second timing signals $T_1$ and $T_2$, the one-bit delayed pulses $z_{i+1}$, and the (n−1)-bit delayed pulses $d_i$ from the circuit input terminals 41 through 45, the flip-flop 46, and the shift register 47 and has first through third memory areas 51, 52, and 53 (not shown in FIG. 2).

Referring temporarily to FIG. 3, the first memory area 51 is for a first data output table and is selected or energized for operation only when the first timing signal $T_1$ is rendered binary "1" in the n-th clock period of a sampling interval for a second sum data word Z under consideration. This area 51 has a plurality of addresses specified by a set of a first through a fifth address pulse. The polarity bits $x_1$, $y_1$, and $z_1$ of the respective data words X, Y, and Z and the integer bits $z_2$ of the second sum data word Z given a delay of one-bit interval by the first flip-flop 46 serve as the first through the fourth address pulses, respectively. The (n−1)-bit delayed pulse $d_i$ produced by the shift register 47 in the n-th clock period represents the least significant digit $z_n$ of the second sum data word Z. Although only the first through the fourth address pulses are sufficient for detection of overflow in the second sum data word Z, the least significant digit $z_n$ is used as the fifth address pulse in order to decide the least significant digit $v_n$ of the overflow-free data word V in the absence of overflow. Prescribed combinations of binary values of $OF_1$, $S_1$, and $D_1$ signals are stored or memorized in the respective addresses. A set of $OF_1$, $S_1$, and $D_1$ pulses are produced with binary values stored in the specified address for the $OF_1$, $S_1$, and $D_1$ signals. The last-mentioned pulse $D_1$ may be called a first-bit pulse because the pulse $D_1$ gives the least significant digit $v_n$ that appears for the first time among the whole bits $v_n$ through $v_1$ of the overflow-free data word V. The $OF_1$ pulse is called a first overflow detect pulse because the pulse $OF_1$ indicates whether or not overflow is present in the second sum data word Z. The overflow detect pulse $OF_1$ is rendered binary "1" and "0" when overflow is detected and not, respectively. The $S_1$ pulse is named a first polarity decision pulse because the pulse $S_1$ decides in effect the binary values or polarities of the whole bits $v_n$ through $v_1$ of the overflow-free data word V as described later when overflow is detected. When overflow is not detected, it is possible to give the polarity decision pulse $S_1$ whichever of binary "0" and "1" values. This fact is depicted by symbols "0/1" in the column for the $S_1$ signal. When overflow for the first range is detected, the polarity decision pulse $S_1$ is given binary "0" and "1" values that are the same as the binary value of the second sum data word polarity bit $z_1$, namely, when the overflow is positive and negative, respectively. In the presence of overflow for the second range, the polarity decision pulse $S_1$ is given binary "0" and "1" values that are different from the binary value of the second sum data word polarity bit $z_1$, namely, again according as the overflow is positive and negative. When the overflow is positive and negative, the first-bit pulse $D_1$ is given binary "1" and "0" values, respectively, that are different from the binary value of the polarity decision pulse $S_1$ and irrespective of the least significant digit $z_n$ of the second sum data word Z.

Referring to FIGS. 2 and 3, the overflow detect and correct circuit 40 comprises second and third flip-flops 57 and 58 supplied with the first overflow detect pulse $OF_1$ and the first polarity decision pulse $S_1$, respectively. The second flip-flop 57 supplies a first one-bit delayed overflow detect pulse $OF_1'$ back to the read-only memory 50. The third flip-flop 58 supplies a first one-bit delayed polarity decision pulse $S_1'$ to the read-only memory 50. The circuit 40 further comprises a circuit output terminal 59, to which the first-bit pulse $D_1$ is supplied as the least significant bit $v_n$ of the overflow-free data word V. When overflow is not detected, production of the least significant digit $v_n$ is as though the least significant digit $z_n$ of the second sum data word Z were supplied directly to the output terminal 59 from the shift register 47.

Turning to FIG. 4, the second memory area 52 is for a second data output table and is rendered operable or energized for the data words X, Y, and Z produced in a particular sampling interval only when both first and second timing signals $T_1$ and $T_2$ are turned to binary "0" in the first through the $(n-3)$-th and the $(n-1)$-th clock periods in a sampling interval next following the particular sampling interval. This area 52 has a plurality of addresses specified by a combination of a first through a third address pulse. Prescribed combinations of binary values of $OF_2$, $S_2$, and $D_2$ signals are stored in the respective addresses. The first and the second address pulses are served, at first in the first clock period, by the first one-bit delayed overflow detect and polarity decision pulses $OF_1'$ and $S_1'$, respectively. The $(n-1)$-bit delayed pulses $d_i$ successively serve as the third address pulses insofar as the second memory area 52 is operative. In the first clock period, a second overflow detect pulse $OF_2$, a second polarity decision pulse $S_2$, and a second-bit pulse $D_2$ are produced with binary values stored in the specified address for the $OF_2$, $S_2$, and $D_2$ signals. The $OF_2$ and $S_2$ pulses are supplied to the second and the third flip-flops 57 and 58, respectively. Second one-bit delayed overflow detect and polarity decision pulses $OF_2'$ and $S_2'$ repeatedly serve as the first and the second address pulses in the second through the $(n-3)$-th clock periods. In the first through the $(n-3)$-th clock periods, the second-bit pulses $D_2$ are successively supplied to the circuit output terminal 59 as the least significant bit but one $v_{n-1}$ through the most significant bit $v_3$ of the decimal part of the overflow-free data word V, respectively. When overflow is not detected, these fractional bits $v_{n-1}$ through $v_3$ are produced irrespective of the first and the second polarity decision pulses $S_1$ and $S_2$ as though the $(n-1)$-bit delayed pulses $d_i$ were successively supplied to the output terminal 59 directly from the shift register 47. When positive overflow is detected, the first and the second address ulses $OF_1'$ and $OF_2'$ and $S_1'$ and $S_2'$ are repeatedly given binary "1" and "0" values, respectively. Second-bit pulses $D_2$ of binary "1" value are repeatedly read out to be successively supplied to the output terminal 59 as the fractional bits $v_{n-1}$ through $v_3$. When negative overflow is detected, both address pulses $OF_1'$ or $OF_2'$ and $S_1'$ or $S_2'$ are rendered binary "1." Second-bit pulses $D_2$ of binary "0" value are repeatedly produced as the fractional bits $v_{n-1}$ through $v_3$. In either event, the fractional bits $v_{n-1}$ through $v_3$ are of the polarity opposite to the common polarity of the first and the second polarity decision pulses $S_1$ and $S_2$ produced one-bit interval earier.

Turning temporarily to FIG. 5, the third memory area 53 is for a third data output table and is put into operation or energized only when the second timing signal $T_2$ is rendered binary "1" in the $(n-2)$-th clock period. This area 53 has a purality of addresses specified by a set of a first through a third address pulse. Prescribed combinations of binary values of $OF_3$, $S_3$, and $D_3$ signals are stored in the respective addresses. The second one-bit delayed overflow detect and polarity decision pulses $OF_2'$ and $S_2'$ and the $(n-1)$-bit delayed pulse or integer bit $z_2$ produced in the $(n-1)$-th clock period serve as the first through the third address pulses. A third overflow detect pulse $OF_3$, a third polarity decision pulse $S_3$, and a third-bit pulse $D_3$ are produced with the binary values stored in the specified address for the $OF_3$, $S_3$, and $D_3$ signals. The $OF_3$ and $S_3$ pulses are supplied to the respective flip-flops 57 and 58. Third one-bit delayed overflow detect and polarity decision pulses $OF_3'$ and $S_3'$ are supplied to the read-only memory 50 back in the $(n-1)$-th clock period. The third-bit pulse $D_3$ is supplied to the circuit output terminal 59 as the integer bit $v_2$ of the overflow-free data word V. When overflow is not detected, the integer bit $v_2$ is produced again as if the integer bit $z_2$ of the second sum data word Z were supplied directly to the output terminal 59 from the shift register 47 irrespective of the first through third polarity decision pulses $S_1$ through $S_3$. When positive overflow is detected, the integer bit $v_2$ is given binary "0" value. In the presence of negative overflow, the integer bit $v_2$ is rendered binary "1." In either case, the integer bit $v_2$ is of the same polarity as the first polarity decision pulse $S_1$ irrespective of the integer bit $z_2$ of the second sum data word Z.

Turning back to FIG. 4, the first and the second address pulses for the second memory area 52 in the $(n-1)$-th clock period are served by the third one-bit delayed overflow detect and polarity decision pulses $OF_3'$ and $S_3'$, respectively. It is to be pointed out that the first polarity decision pulse $S_1$ has eventually resulted in the third polarity decision pulse $S_3$ of the different binary value. The third address pulse is served in the $(n-1)$-th clock period by the $(n-1)$-bit delayed pulse or the polarity bit $z_1$ of the second sum data word Z. The second overflow detect and polarity decision pulses $OF_2$ and $S_2$ are again produced but have no effect because the second one-bit delayed overflow detect and polarity decision pulses $OF_2'$ and $S_2'$ are not used in the next n-th clock period as the address pulses. The second-bit pulse $D_2$, which may now be called a fourth-bit pulse, is supplied to the output terminal 59 as the polarity bit $v_1$ of the overflow-free data word V. When overflow is not detected, the polarity bit $v_1$ is produced as though the polarity bit $z_1$ of the second sum data word Z were supplied directly to the output terminal 59 from the shift register 47. In the presence of positive overflow, the polarity bit $v_1$ is given binary "0" value. When negative overflow is detected, the polarity bit $v_1$ is rendered binary "1." In either event, the polarity bit $v_1$ is decided in coincidence with the first polarity decision pulse $S_1$ irrespective of the polarity bit $z_1$ of the second sum data word Z.

Reviewing FIGS. 2 through 5, it is now understood that those parts marked by the legends "no overflow" in the first through the third memory areas 51 through 53, as called hereinabove, are used only when the overflow detect pulse $OF_1$, $OF_2$, or $OF_3$ indicates absence of overflow and may be referred to as a fourth memory area. In this case, the remaining parts may be deemed as new first through third memory areas for producing only the first overflow detect and polarity decision pulses $OF_1$ and $S_1$, the second overflow detect and polarity decision pulses $OF_2$ and $S_2$, and the third overflow detect and polarity decision pulses $OF_3$ and $S_3$, respectively, only when the overflow detect pulse $OF_1$, $OF_2$, or $OF_3$ indicates presence of overflow. As is clear from the concept of the fourth memory area, it is unnecessary that each of the first through the third memory areas should occupy consecutive addresses in the read-only memory 50 and that the addresses and the memorized binary values should be arranged in the order depicted. The polarity decision pulses $S_1$ through $S_3$ are unnecessary to specify the fourth memory area addresses. The second and the third flip-flops 57 and 58 serve as means for retaining the overflow detect and the polarity decision pulses $OF_1$, $OF_2$, or $OF_3$ and $S_1$, $S_2$, or $S_3$, with the polarities interchanged between the second and the third polarity decision pulses $S_2$ and $S_3$. Alternatively, the second and the third overflow detect pulses $OF_2$ and $OF_3$ may be regarded as mere repetition of the first overflow detect pulse $OF_1$ or a single overflow detect pulse. Simialrly, the second and the third memory areas 52 and 53 only repeat the first polarity decision pulse $S_1$ in the first through the $(n-3)$-th clock periods. It is therefore possible to understand the first and the second polarity decision pulses $S_1$ and $S_2$, as named hereinabove, to be mere repetition of a new first polarity decision pulse with the "third" polarity decision pulse $S_3$ deemed to be a new second polarity decision pulse. As a further alternative, it is possible to understand that only one polarity decision pulse is used in the presence of overflow for deciding the polarity of the overflow-free fractional bits $v_n$ through $v_3$ opposite to the polarity of the new single polarity decision pulse and the overflow-free integer and sign bits $v_2$ and $v_1$ in coincidence therewith. On the other hand, the new first memory area may be deemed to consist of a first and a second part. The first part is for memorizing the binary value combinations for the single overflow detect pulse and the new first or single polarity decision pulse. The second part is for memorizing prescribed binary values for the first-bit pulse $D_1$. Although unnecessary, the successive bits $x_i$, $y_i$, $z_i$, or $z_{i+1}$ of each of the first sum, the second feedback, and the second sum data words X, Y, Z and of a sequence of the one-bit delayed pulses $z_{i+1}$ may be supplied to the second and the third memory areas 52 and 53. For interpretation of the appended claims, it is possible to understand that the first and the second timing input terminals 44 and 45 show means for generating the first and the second timing signals $T_1$ and $T_2$ and that the legend '$T_1=$"1"' and the like represent means for energizing the first through the third memory areas. Each of the latter means is readily impelented by an electronic switch.

Figure 6:
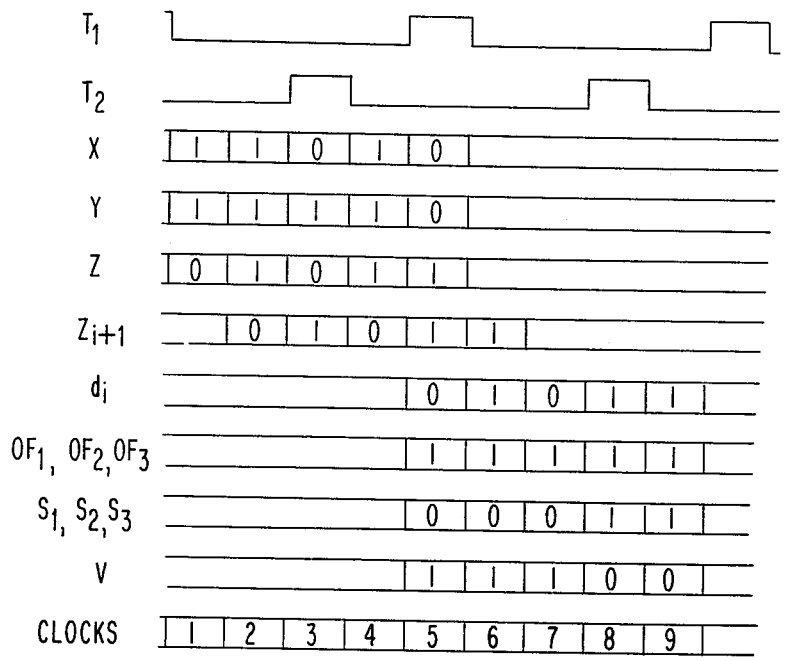
FIG. 6 is a schematic time chart for describing operation of the circuit illustrated in FIGS. 2 through 5.

Referring to FIG. 6, detailed time sequential operation of the overflow detect and correct circuit 40 will be described for a set of examples where the first sum data word X and the second feedback data word Y are "(0)1.011" or decimal 1.375 and "(0)1.111" or decimal 1.875, respectively. The true sum data word U is "(0)11.010" or decimal 3.250. A second sum data word Z is given by "(1)1.010" or minus 0.750 in decimal representation under the circumstances. As described, the overflow-free data word V should be "(0)0.111" or decimal 0.875. Here, the clock periods are serially numbered from the first clock period of simultaneous application to the read-only memory 50 of the least significant digits of the respective data words X, Y, and Z as indicated at the bottom of this figure. The first and the second timing signals $T_1$ and $T_2$ are therefore rendered binary "1" in the fifth and the eighth clock periods, respectively. During the first through the fourth clock periods, the read-only memory 50 is dealing with another data word next preceding the second sum data word Z under consideration. In the meantime, the least significant digit $z_n$ through the integer bit $z_2$, or the fifth through the second bits $z_5$ through $z_2$, of the second sum data word Z are stored in the shift register 47. When the first timing signal $T_1$ is rendered binary "1" in the fifth clock period, the polarity bits $x_1$, $y_1$, and $z_1$ of the respective data words X, Y, and Z and the integer bit $z_2$ of the second sum data word Z are simultaneously supplied to the first memory area 51 (FIG. 3) from the data word input terminals 41 through 43 and from the first flip-flop 46, respectively. Inasmuch as the bits $x_1$ and $y_1$ are binary "0" and the bits $z_1$ and $z_2$, binary "1," the first overflow detect pulse $OF_1$ and the first polarity decision pulse $S_1$ are given binary "1" and "0" values, respectively. The least significant digit $z_n$ or the fifth bit $z_5$ of the second sum data word Z is also supplied to the first memory area 51 from the shift register 47. Irrespective of the binary value of the fifth bit $z_5$, a first-bit pulse $D_1$ is given binary "1" value, namely, the polarity opposite to that of the polarity decision pulse $S_1$, and supplied to the circuit output terminal 59 as the least significant bit $v_n$ or the fifth bit $v_5$ of the overflow-free data word V.

Further referring to FIG. 6, a set of first one-bit delayed overflow detect and polarity decision pulses $OF_1'$ and $S_1'$ produced by the second and the third flip-flops 57 and 58 with binary "1" and "0" values, respectively, is supplied in the sixth clock period to the second memory area 52 (FIG. 4), together with the least significant bit but one $z_{n-1}$ or the fourth bit $z_4$ of binary "1" value of the second sum data word Z. The second memory area 52 supplies a set of second overflow detect and polarity decision pulses $OF_2$ and $S_2$ to the respective flip-flops 57 and 58 with binary "1" and "0" values, respectively, and a second-bit pulse $D_2$ of binary "1" value to the circuit output terminal 59 as the least significant bit but one $v_{n-1}$ or the fourth bit $v_4$ of the overflow-free data word V. In the seventh clock period, a set of second one-bit delayed overflow detect and polarity decision pulses $OF_2'$ and $S_2'$ is supplied back to the second memory area 52, together with the third or the most significant bit of the decimal part $z_3$ of the second sum data word Z. Another set of second overflow detect and polarity decision pulses $OF_2$ and $S_2$ is produced again with binary "1" and "0" values, respectively. Another second-bit pulse $D_2$ is produced again with binary "1" value and supplied to the output terminal 59 as the third bit $v_3$ of the overflow-free data word V. In the eighth clock period, when the second timing signal $T_2$ is given binary "1" value, another set of second one-bit delayed overflow detect and polarity decision pulses $OF_2'$ and $S_2'$ is supplied to the third memory area 53 (FIG. 5), together with the integer bit $z_2$ of the second sum data word Z. The third memory area 53 supplies third overflow detect and polarity decision pulses $OF_3$ and $S_3$ to the respective flip-flops 57 and 58, both with binary "1" value, and a third-bit pulse $D_3$ of binary "0" value, namely, of the same polarity as the first polarity decision pulse $S_1$, to the circuit output terminal 59 as the integer bit $v_2$ of the overflow-free data word V. When both first and second timing signals $T_1$ and $T_2$ are again rendered binary "0" in the ninth clock period, the third one-bit delayed overflow detect and polarity decision pulses $OF_3'$ and $S_3'$ are supplied to the second memory area 52 together with the polarity bit $z_1$ of the second sum data word Z. Still another set of second overflow detect and polarity decision pulses $OF_2$ and $S_2$ is produced, both with binary "1" value. Still another second-bit pulse $D_2$ is produced and supplied to the output terminal 59 as the polarity bit $v_1$ of the overflow-free data word V with binary "0" value, namely, with the same polarity as the first polarity decision pulse $S_1$.

Figure 7:
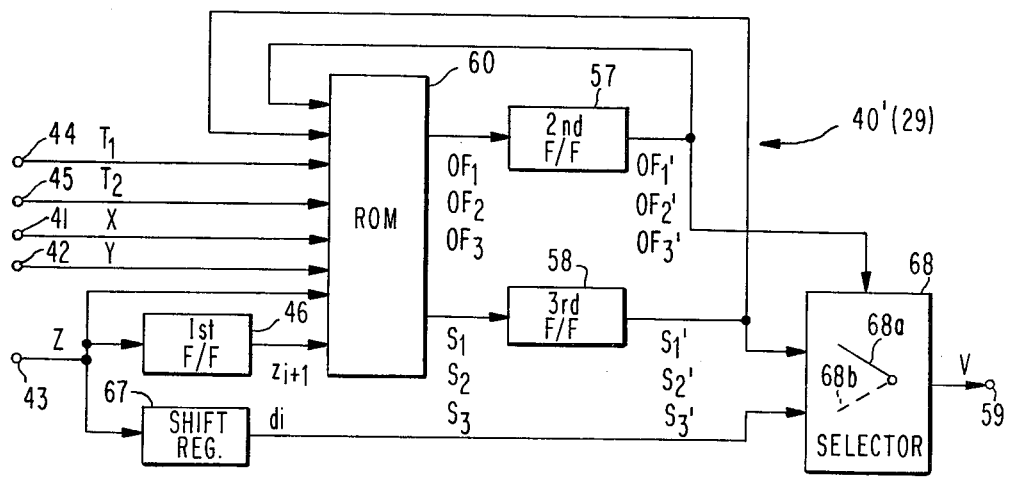
FIG. 7 is a block diagram of an overflow detect and correct circuit for use in a recursive digital filter according to a second embodiment of this invention.

Referring now to FIG. 7, an overflow detect and correct circuit 40' is for use in a recursive digital filter according to a second embodiment of this invention as the overflow detect and correct circuit 29 and comprises similar parts designated by like reference numerals as in FIG. 2. As would have been understood from the description of the overflow detect and correct circuit 40, the $(n-1)$-bit delayed pulses $d_i$ may successively be supplied to the circuit output terminal 59 directly from the shift register 47 when overflow is not detected. The circuit 40' therefore comprises a read-only memory 60 for producing the overflow-free data word V only in the presence of overflow and meaningless pulses when overflow is not detected. The first and the second timing signals $T_1$ and $T_2$ again specify the n-th and the $(n-2)$-th clock periods, respectively. The read-only memory 60 again comprises first through third memory areas 61, 62, and 63 (not depicted in FIG. 6). When the first timing signal $T_1$ is given binary "1" value in the n-th clock period, the first memory area 61 supplies a first overflow detect pulse $OF_1$ and a first polarity decision pulse $S_1$ to the second and the third flip-flops 57 and 58, respectively. When both first and second timing signals $T_1$ and $T_2$ are rendered binary "0" in the first through the $(n-3)$-th and the $(n-1)$-th clock periods, the second memory area 62 supplies second overflow detect and polarity decision pulses $OF_2$ and $S_2$ to the respective flip-flops 57 and 58. When the second timing signal $T_2$ is given binary "1" value in the $(n-2)$-th clock period, the third memory area 63 supplies a third overflow detect pulse $OF_3$ and a third polarity decision pulse $S_3$ to the flip-flops 57 and 58. As has already been pointed out, it is unnecessary to produce the first-bit through the third-bit or the fourth-bit pulses $D_1$ through $D_3$. The second and the third flip-flops 57 and 58 supply first through third one-bit delayed overflow detect pulses $OF_1'$, $OF_2'$, and $OF_3'$ and first through third one-bit delayed polarity decision pulses $S_1'$, $S_2'$, and $S_3'$ back to the read-only memory 60.

Further referring to FIG. 7, the overflow detect and correct circuit 40' comprises a shift register 67 responsive to the second sum data word Z supplied from the third data word input terminal 43 for successively producing one-word or n-bit delayed pulses $d_i$ (the same reference character being used merely for convenience) by memorizing one word or n bits of the data word Z, such as the whole bits $z_n$ through $z_1$, and a selector 68 controlled by the one-bit delayed overflow detect pulse $OF_1'$, $OF_2'$, or $OF_3'$ for selectively supplying the circuit output terminal 59 with the n-bit delayed pulses $d_i$ as the overflow-free data word V in the absence of overflow and the one-bit delayed polarity decision pulses $S_1'$ through $S_3'$ as the data word V when overflow is detected. As symbolized by a mechanical switch arm operable between two positions 68a and 68b, it is possible to understand the selector 68 to comprise a first and a second section, which may in fact be a pair of electronic switches. It should therefore be clearly understood that the word "selector" as used herein means any one of equivalent circuits.

Referring to FIG. 8, the first memory area 61 is rendered operative only when the first timing signal $T_1$ specifies the n-th clock period. This area 61 comprises a plurality of addresses specified by a combination of four address pulses, namely, the polarity bits $x_1$, $y_1$, and $z_1$ of the respective data words X, Y, and Z and the simultaneously supplied integer bit $z_2$ of the second sum data word Z. When overflow is not detected, the first overflow detect pulse $OF_1$ is given binary "0" value and the first polarity decision pulse $S_1$, whichever of binary "0" and "1" values. In the first clock period, the first one-bit delayed overflow detect pulse $OF_1'$ is supplied to the selector 68 to make the same select the n-bit delayed pulse $d_i$, namely, the least significant digit $z_n$ of the second sum data word Z, as the least significant digit $v_n$ of the overflow-free data word V. When overflow is detected, the first overflow detect pulse $OF_1$ is given binary "1" value and the first polarity decision pulse $S_1$, binary "0" and "1" values according as the detected overflow is negative and positive, respectively. These polarities are opposite to those of the first polarity decision pulse $S_1$ produced by the above-mentioned read-only memory 50. This is because the first one-bit delayed pulse $S_1'$ is directly selected by the selector 68 in the first clock period as the least significant digit $v_n$ of the overflow-free data word V.

Turning to FIG. 9, the second memory area 62 is operable only when both first and second timing signals $T_1$ and $T_2$ are rendered binary "0" in the first through the $(n-3)$-th and the $(n-1)$-th clock periods. This area 62 comprises a plurality of addresses specified at first in the first clock period by a set of first one-bit delayed overflow detect and polarity decision pulses $OF_1'$ and $S_1'$, subsequently in the second through the $(n-3)$-th clock periods by successive sets of second one-bit delayed overflow detect and polarity decision pulses $OF_2'$ and $S_2'$, and finally in the $(n-1)$-th clock period by a set of third one-bit delayed overflow detect and polarity decision pulses $OF_3'$ and $S_3'$. When overflow is not detected, the second overflow detect pulse $OF_2$ is again given binary "0" value and the second polarity decision pulse $S_2$, whichever of binary "0" and "1" values. The second one-bit delayed overflow detect pulses $OF_2'$ are successively supplied to the selector 68 to make the same select the n-bit delayed pulses $d_i$ as the least significant bit but one $v_{n-1}$ through the third bit $v_3$ of the overflow-free data word V in the second through the $(n-2)$-th clock periods and the sign bit $v_1$ thereof in the n-th clock period. When overflow is detected, the second overflow detect pulse $OF_2$ is given binary "1" value and the second polarity decision pulse $S_2$, binary "0" and "1" values according as the detected overflow is negative and positive, respectively. In the second through the $(n-2)$-th clock periods, the second one-bit delayed overflow detect pulses $OF_2'$ are successively supplied to the selector 68 to make the same select the second one-bit delayed polarity decision pulses $S_2'$ as the fractional bits except the least significant digit $v_{n-1}$ through $v_3$.

Turning temporarily to FIG. 10, the third memory area 63 is put into operation when the second timing signal $T_2$ specifies the $(n-2)$-th clock period. This area 63 comprises a plurality of addresses specified by the second one-bit delayed overflow detect and polarity decision pulses $OF_2'$ and $S_2'$ repeated by the second memory area 62 in the $(n-3)$-th clock period and then given a delay of one-bit interval. When overflow is not detected, the third overflow detect pulse $OF_3$ is given binary "0" value and the third polarity decision pulse $S_3$, again whichever of binary "0" and "1" values. Third one-bit delayed overflow detect pulse $OF_3'$ is supplied to the selector 68 in the $(n-1)$-th clock period to make the same select the n-bit delayed pulse $d_i$, or the integer bit $z_2$ of the second sum data word Z, as the integer bit $v_2$ of the overflow-free data word V. When overflow is detected, the third overflow detect pulse $OF_3$ is again given binary "1" value and the third polarity decision pulse $S_3$, binary "0" and "1" value now according as the detected overflow is positive and negative, respectively. In the $(n-1)$-th clock period, the third one-bit delayed overflow detect pulse $OF_3'$ is supplied to the selector 68 for selection of the third one-bit delayed polarity decision pulse $S_3'$ as the integer bit $v_2$ of the overflow-free data word V.

Turning back to FIG. 9 and reviewing FIGS. 7 through 10, the third one-bit delayed overflow detect and polarity decision pulses $OF_3'$ and $S_3'$ are supplied also to the second memory area 62 in the $(n-1)$-th clock period, when this memory area 62 is again put into operation. When overflow is detected, the second overflow detect pulse $OF_2$ is once more given binary "1" value and the second polarity decision pulse $S_2$, binary "0" and "1" values now for positive and negative overflow, respectively. In the n-th clock period, the second one-bit delayed polarity decision pulse $S_2'$ is selected by the selector 68 under the control of the second one-bit delayed overflow detect pulse $OF_2'$ as the polarity bit $v_1$ of the overflow-free data word V. It is now understood that the polarity decision pulses $S_1$ through $S_3$ may be produced with the same polarities as those described with reference to FIGS. 2 through 6 provided that the selector 68 comprises an inverter (not shown) for the one-bit delayed polarity decision pulses $S_1'$ through $S_3'$. It is also possible to understand that one of the selector sections mentioned hereinabove serves as a first and a second part in a time shared fashion, in the first through the $(n-2)$-th and the n-th clock periods and in the $(n-1)$-th clock period, respectively, and the other selector section as a third part operable throughout the clock periods. An $(n-1)$-stage shift register, such as the shift register 47, may be substituted for the n-stage shift register 67 with the overflow detect and the polarity decision pulses $OF_1$ through $OF_3$ and $S_1$ through $S_3$ supplied directly to the selector 68 from the read-only memory 60.

Figure 11:
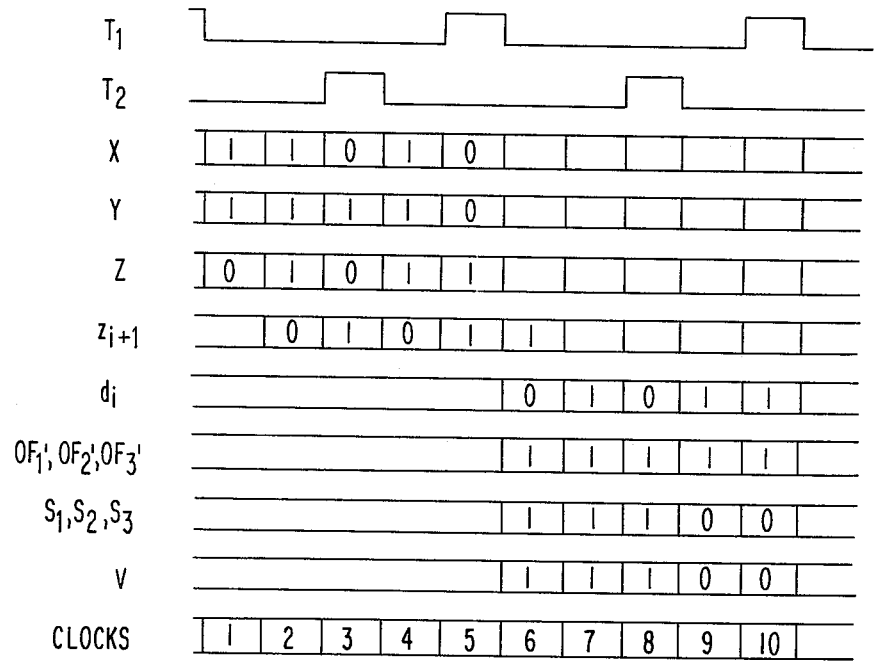
FIG. 11 is a schematic time chart for describing operation of the circuit depicted in FIGS. 7 through 10.

Referring to FIG. 11, it is to be noted that the one-bit delayed overflow detect pulses $OF_1'$, $OF_2'$, or $OF_3'$ and the one-bit delayed polarity decision pulses $S_1'$, $S_2'$, or $S_3'$ are depicted here rather than the overflow detect pulses $OF_1$, $OF_2$, or $OF_3$ and the polarity decision pulses $S_1$, $S_2$, or $S_3$ shown in FIG. 6. In other respects, including the examples of the first sum and the second feedback data words X and Y, FIG. 11 is similar to the already described FIG. 6. During the first through the fourth clock periods, another data word next preceding the second sum data word Z under consideration is dealt with by the overflow detect and correct circuit 40'. In the meanwhile, the first or polarity bit of the preceding data word and the least significant or fifth bit $z_5$ through the second or integer bit $z_2$ of the data word Z in question are stored in the shift register 67. When the first timing signal $T_1$ is rendered binary "1" in the fifth clock period, the fifth bit $z_5$ through the first or polarity bit $z_1$ are stored in the shift register 67. At the same time, the polarity bits $x_1$, $y_1$, and $z_1$ of the respective data words X, Y, and Z and the integer bit $z_2$ of the second sum data word Z are simultaneously supplied to the first memory area 61 (FIG. 8) of the read-only memory 60. Both first overflow detect and polarity decision pulses $OF_1$ and $S_1$ are given binary "1" value. In the sixth clock period, the shift register 67 supplies the fifth or least significant bit $z_5$ to the selector 68. The selector 68, however, selects the first one-bit delayed polarity decision pulse $S_1'$ as the least significant or fifth bit $v_5$ of the overflow-free data word V under the control of the first one-bit delayed overflow detect pulse $OF_1'$. On the other hand, the second memory area 62 (FIG. 9) gives both second overflow detect and polarity decision pulses $OF_2$ and $S_2$ binary "1" value. These pulses give, in the seventh clock period, binary "1" value to the fourth bit $v_4$ and also to a second set of the second overflow detect and polarity decision pulses $OF_2$ and $S_2$. When the second timing signal $T_2$ is turned to binary "1" in the eighth clock period, the third bit $v_3$ is again given binary 37 1" value. The second one-bit delayed overflow detect and polarity decision pulses $OF_2'$ and $S_2'$ are now supplied to the third memory area 63 (FIG. 10). The third overflow detect and polarity decision pulses $OF_3$ and $S_3$ are given binary "1" and "0" values, respectively. In the ninth clock period, the third one-bit delayed polarity decision pulse $S_3'$ is selected as the integer bit $v_2$. The third one-bit delayed overflow detect and polarity decision pulses $OF_3$ and $S_3$ are now supplied to the second memory area 62. The second overflow detect and polarity decision pulses $OF_2$ and $S_2$ of a third set are given binary "1" and "0" values, respectively. In the tenth clock period, the polarity bit $v_1$ is given binary "0" value. On the other hand, the first timing signal $T_1$ is again rendered binary "1" to put the first memory area 61 again into operation for a data word, if any, next following the data word Z that has just been disposed of.

Figure 12:
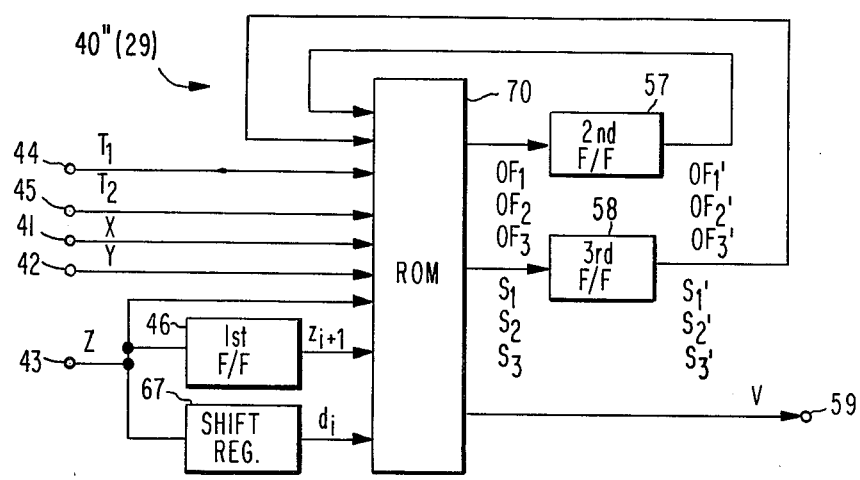
FIG. 12 is a block diagram of an overflow detect and correct circuit for use in a recursive digital filter according to a third embodiment of this invention.

Referring now to FIG. 12, an overflow detect and correct circuit 40" is for use in a recursive digital filter according to a third embodiment of this invention as the overflow detect and correct circuit 29 and again comprises similar parts designated by like reference numerals as in FIG. 2. Use is again made of a shift register 67 for one word or n bits. The n-bit delayed pulses $d_i$ are, however, supplied to a 512-word three-bit read-only memory 70 that comprises first through fourth memory areas 71, 72, 73, and 74 (not shown in FIG. 12). The first timing signal $T_1$ specifies the n-th clock period, namely, the clock period in which the polarity bits $x_1$, $y_1$, and $z_1$ of the respective data words X, Y, and Z and the integer bit $z_2$ of the second sum data word Z are simultaneously supplied to the read-only memory 70. The second timing signal $T_2$ is rendered binary "1" in the $(n-1)$-th clock period rather than in the $(n-2)$-th clock period. The fourth memory area 74 is energized when the first timing signal $T_1$ is given binary "1" value, simultaneously with energization of the first memory area 71.

Referring to FIGS. 13 through 15, the first memory area 71 is similar to the first memory area 51 illustrated with reference to FIG. 3 except that use is made only of the polarity bits $x_1$, $y_1$, and $z_1$ and the integer bit $z_2$ to specify the address in the n-th clock period and that only the first overflow detect and polarity decision pulses $OF_1$ and $S_1$ are produced without the first-bit pulse $D_1$. In other words, the first memory area 71 has no "second part." The second memory area 72 addressed in the first clock period by the first one-bit delayed overflow detect and polarity decision pulses $OF_1'$ and $S_1'$ and the third memory area 73 are quite similar to the corresponding memory areas 52 and 53 except that the second memory area 72 is adressed in the second through the (n−2)-th clock periods by the second one-bit delayed overflow detect and polarity decision pulses $OF_2'$ and $S_2'$ and produces "second-bit" pulse $D_2$ as the whole fractional bits $v_n$ through $v_3$ of the overflow-free data word V in the first through the (n−2)-th clock periods and that the third memory area 73 is specified in the (n−1)-th clock period, when the second timing signal $T_2$ is given binary "1" value, by the second one-bit delayed overflow detect and polarity decision pulses $OF_2'$ and $S_2'$ derived from the second overflow detect and polarity decision pulses $OF_2$ and $S_2$ produced by the second memory area 72 in the (n−2)-th clock period and produces a "third-bit" pulse $D_3$ for use as the overflow-free integer bit $v_2$ in the (n−1)-th clock period.

Turning to FIGS. 16 and 17 and reviewing FIGS. 12 through 16, the fourth memory area 74 is addressed in the n-th clock period, one sampling interval after energization of the first memory area 71 for the data word Z under consideration, by the third one-bit delayed overflow detect and polarity decision pulses $OF_3'$ and $S_3'$ derived from the third overflow detect and polarity decision pulses $OF_3$ and $S_3$ produced by the third memory area 73. The fourth memory area 74 produces a "fourth-bit" pulse $D_4$ in the n-th clock period as the overflow-free polarity bit $v_1$. As shown in FIG. 17 for the examples cited in describing operation of the above-illustrated circuits 40 and 40′, operation of the overflow detect and correct circuit 40″ is quite similar to that illustrated with reference to FIG. 11. Inasmuch as the fourth memory area 74 is energized together with the first memory area 71, it is possible to deem these memory areas 71 and 74 to be a first and a second section of a combined memory area. It is also possible to understand that a fifth memory area is formed by those parts of the first through the fourth memory areas 71 through 74 which memorize prescribed binary values for the whole overflow-free bits $v_n$ through $v_l$ for use when the overflow detect pulse $OF_1$, $OF_2$, or $OF_3$ indicates absence of overflow.

Although not explicitly described hereinabove, the overflow-free data word V supplied as the feedback data words, such as Y, is a second overflow-free data word, if any, produced at least one sampling interval before the data word V under consideration, which may be referred to as a first overflow-free data word although the numbering is in contradiction to the sequence of production. In fact, the input data words W are usually time-division multiplexed for a plurality of original analog signals. Delays of certain durations, which may not necessarily be intergral multiples of the clock period, are inevitably introduced by the multipliers, such as 33 and 34 into the feedback data words among others. It is therefore unavoidable in general to use the delay circuits 31 and 32 even when the overflow-free data words V are produced with a one-word delay. As the case may be, another delay element (not shown) is interposed between the overflow and correct circuit 29 (FIG. 1), on the one hand, and the delay element 31 and the third multiplier 34, on the other hand, or anywhere else.

It is possible to apply the above-described principles for detecting the overflow to numbers exceeding decimal two in absolute value and to a case where two's complement representation is applied to positive numbers rather than to negative numbers. Parallel-to-series conversion and rearrangement of an order of serial bits to another are not difficult in digital techniques, although the above-exemplified order of the serial bits is believed to be most preferable for simplicity of circuitry. Use is possible of at least one additional timing signal that specifies at least one prescribed bit in, for example, putting the second memory area 52, 62, or 72 into operation. As exemplified by the selector 68, it is possible in the overflow detect and correct circuit, such as 40 or 40″, to use the overflow detect pulse $OF_1$, $OF_2$, or $OF_3$ in controlling the output pulses of the respective memory areas by logic or switch circuits (not shown). It is also possible to select any desired numbers other than the above-cited numbers as the numbers for the overflow-free data words V in the presence of overflow. For this and other purposes, use may be made of additional memory area or areas. Other modifications are also possible without departing from the spirit of this invention.

What is claimed is:

1. In a recursive digital filter comprising a first adder responsive to each of input data words and a first feedback data word for producing a first sum data word, a second adder responsive to said first sum data word and a second feedback data word for producing a second sum data word, an overflow detect and correct circuit for detecting overflow in said second sum data word and producing a first of overflow-free data words by correcting, when overflow is detected, the detected overflow, a first and a second feedback device responsive to said first and all other overflow-free data words for producing said first and said second feedback data words, respectively, and means responsive to all said overflow-free data words for producing output data words, all said data words being given by two's complement representation in a common word format comprising a sign bit, an integer bit, and a predetermined number of fraction bits, each of all said data words thus having corresponding bits in others of all said data words, said first adder, said second feedback device, and said second adder substantially simultaneously producing the corresponding bits of the respective ones of said first sum, said second feedback, and said second sum data words in bit series, the improvement wherein said overflow detect and correct circuit comprises:

first means responsive to the sign bits of said first sum, said second feedback, and said second sum data words and the integer bit of said second sum data word for producing an overflow detect pulse indicative of presence and absence of the overflow and a first polarity decision pulse indicative at least when said overflow detect pulse indicates presence of overflow, of polarities of the sign, the integer, and the fractional bits of said first overflow-free data word;

second means responsive to said overflow detect and said first polarity decision pulses for producing, only when said overflow detect pulse indicates presence of overflow, the sign, the integer, and the fractional bits of said first overflow-free data word with polarities decided by said first polarity decision pulse; and third means responsive to said overflow detect pulse and said second sum data word for producing, only when said overflow detect pulse indicates absence of overflow, the sign, the integer, and the fractional bits of said first overflow-free data word with polarities determined by the corresponding bits of said second sum data word.

2. A recursive digital filter as claimed in claim 1, each of said first adder, said second feedback device, and said second adder producing the successive bits of a relevant one of said first sum, said second feedback, and said second sum data words in synchronism with clock periods, wherein:

said second means comprises fourth and fifth means;
said overflow detect and correct circuit further comprising:
sixth means responsive to said second sum data word for giving a delay of one clock period to all bits of said second sum data word to produce a one-bit delayed data word;
seventh means for supplying said first sum, said second feedback, said second sum, and said one-bit delayed data words to said first means;
eighth means for generating first and second timing signals that specify the clock periods for a first and a second prescribed bit, respectively, of each of said first sum, said second feedback, and said second sum data words; and
ninth means comprising, in turn;
  means responsive to said first and said second timing signals for energizing said first means only when said first timing signal specifies the clock period for said first prescribed bit;
  means responsive to said first and said second timing signals for energizing said fifth means only when said second timing signal specifies the clock period for said second prescribed bit; and
  means responsive to said first and said second timing signals for energizing said fourth means when said first and said second timing signals do not specify the clock periods for said first and said second prescribed bits;
said fifth means, when energized, being responsive to said overflow detect and said first polarity decision pulses for producing a second polarity decision pulse with a polarity decided by said first polarity decision pulse and for producing, only when said overflow detect pulse indicates presence of overflow, the integer bit of said first overflow-free data word with a polarity decided by said second polarity decision pulse;
said fourth means, when energized, being responsive to said overflow detect and said first and said second polarity decision pulses for producing, only when said overflow detect pulse indicates presence of overflow, the fractional bits and the sign bit of said first overflow-free data word with polarities decided by said first and said second polarity decision pulses, respectively.

3. A recursive digital filter as claimed in claim 2, said word format comprising the sign bit at the most significant digit, the integer bit at the most significant digit but one, and the fractional bits at the most significant digit but two through the least significant digit, said first adder, said second feedback device, and said second adder producing said first sum, said second feedback, and said second sum data words, respectively, from the least significant digits to the most significant digits, wherein said third means comprises:

delay means responsive to said second sum data word for giving a preselected delay to all bits of said second sum data word to produce a delayed sum data word comprising a delayed sign bit, a delayed integer bit, and a plurality of delayed fractional bits according to said word format, the delayed least significant digit being produced at the earliest when said seventh means supplies said first means with the sign bits of said first sum, said second feedback, and said second sum data words and with the integer bit of said one-bit delayed data word; and tenth means responsive to said overflow detect pulse and said delayed sum data word for producing, only when said overflow detect pulse indicates absence of overflow, said delayed fractional, integer, and sign bits as the corresponding bits of said first overflow-free data word.

4. A recursive digital filter as claimed in claim 3, said eighth means generating said first and said second timing signals to specify the clock periods for the sign bit of each of said first sum, said second feedback, and said second sum data words and for the most significant bit among the fractional bits thereof as the clock periods for said first and said second prescribed bits, respectively, wherein:

said overflow detect and correct circuit still further comprises a memory device comprising, in turn, a first through a fourth memory area, said first memory area having a first and a second part;
said first means comprising said first part of said first memory area;
said first memory area having a plurality of addresses specified, when said first means is energized, by the sign bits of said first sum, said second feedback, and said second sum data words and the integer bit of said one-bit delayed data word;
said first part memorizing prescribed combinations of binary values in the respective addresses for producing said overflow detect and said first polarity decision pulses with polarities given by the respective binary values memorized in the specified address;
said fourth means comprising said second memory area and said second part of said first memory area;
said second part memorizing prescribed binary values in the respective addresses for producing, only when said overflow detect pulse indicates presence of overflow, the least significant digit of said first overflow-free data word with a polarity decided by the binary value memorized in the specified address;
said second memory area having a plurality of addresses specified, when said fourth means is energized, by said overflow detect pulse and at first by said first polarity decision pulse and subsequently by said second polarity decision pulse and memorizing prescribed combinations of binary values in the respective second memory area addresses for repeating said overflow detect and said first polarity decision pulses with polarities given by the respective binary values memorized in the second memory area address specified by said overflow detect and said first polarity decision pulses and for producing, only when said overflow detect pulse indicates presence of overflow, the fractional and the sign bits of said first overflow-free data word except the least significant digit thereof with polarities decided by the respective binary values memorized in the second memory area addresses specified by said overflow detect and said first polarity decision pulses and by said overflow detect and said second polarity decision pulses, respectively;

said fifth means comprising said third memory area, said third memory area having a plurality of addresses specified, when said fifth means is energized, by said overflow detect and said first polarity decision pulses and memorizing prescribed combinations of binary values in the respective third memory area addresses for repeating said overflow detect pulse and producing said second polarity decision pulse and, only when said overflow detect pulse indicates presence of overflow, the integer bit of said first overflow-free data word with polarities given and decided by the respective binary values memorized in the specified address of said third memory area;

said tenth means comprising said fourth memory area, said fourth memory area having a plurality of addresses specified by said overflow detect pulse and said delayed fractional, integer, and sign bits and memorizing prescribed binary values in the respective fourth memory area addresses for producing, only when said overflow detect pulse indicates absence of overflow, the fractional bits, the integer bit, and the sign bit of said first overflow-free data word with polarities determined by the respective binary values memorized in the fourth memory area addresses specified by the corresponding bits, respectively, of said delayed sum data word.

5. A recursive digital filter as claimed in claim 3, said eighth generating said first and said second timing signals to specify the clock periods for the sign bit of each of said first sum, said second feedback, and said second sum data words and for the most significant bit among the fractional bits thereof as the clock periods for said first and said second prescribed bits, respectively, wherein:

said overflow detect and correct circuit still further comprises:

a memory device comprising a first through a third memory area; and a selector comprising a first through a third part;

said first means comprising said first memory area, said first memory area having a plurality of addresses specified, when said first means is energized, by the sign bits of said first sum, said second feedback, and said second sum data words and the integer bit of said one-bit delayed data word and memorizing prescribed combinations of binary values in the respective addresses for producing said overflow detect and said first polarity decision pulses with polarities given by the respective binary values memorized in the specified address;

said fourth means comprising said second memory area and said first part of said selector;

said second memory area having a plurality of addresses specified, when said fourth means is energized, by said overflow detect pulse and at first by said first polarity decision pulse and subsequently by said second polarity decision pulse and memorizing prescribed combinations of binary values in the respective second memory area addresses for repeating said overflow detect and said first polarity decision pulses with polarities given by the respective binary values memorized in the second memory area address specified at first by said overflow detect and said first polarity decision pulses and subsequently by said overflow detect and said second polarity decision pulses;

said first part of said selector being responsive to said overflow detect and said first and said second polarity decision pulses for producing, only when said overflow detect pulse indicates presence of overflow, said first and said second polarity decision pulses as the fractional bits and the sign bit, respectively, of said first overflow-free data word;

said fifth means comprising said third memory area and said second part of said selector;

said third memory area having a plurality of addresses specified, when said fifth means is energized, by said overflow detect and said first polarity decision pulses and memorizing prescribed combinations of binary values in the respective third memory area addresses for repeating said overflow detect pulse and producing said second polarity decision pulse with polarities given by the respective binary values memorized in the specified address of said third memory area;

said second part of said selector being responsive to said overflow detect and said second polarity decision pulse for producing, only when said overflow detect pulse indicates presence of overflow, said second polarity decision pulse as the integer bit of said first overflow-free data word;

said tenth means comprising said third part of said selector, said third part of said selector being responsive to said overflow detect pulse and said delayed sum data word for producing, only when said overflow detect pulse indicates absence of overflow, said delayed fractional, integer, and sign bits as the corresponding bits of said first overflow-free data word.

6. A recursive digital filter as claimed in claim 1, each of said first adder, said second feedback device, and said second adder producing the successive bits of a relevant one of said first sum, said second feedback, and said second sum data words in synchronism with clock periods, wherein:

said second means comprises fourth through sixth means;

said overflow detect and correct circuit further comprising:

seventh means responsive to said second sum data word for giving a delay of one clock period to all bits of said second sum data word to produce a one-bit delayed data word;

eighth means for supplying said first sum, said second feedback, said second sum, and said one-bit delayed data words to said first means;

ninth means for generating a first and a second timing signal that specify the clock periods for a first and a second prescribed bit, respectively, of each of said first sum, said second feedback, and said second sum data words; and tenth means responsive to said first and said second timing signals for energizing said first and said sixth means only when said first timing signal specifies the clock period for said first prescribed bit, said fifth means only when said second timing signal specifies the clock period for said second prescribed bit, and otherwise said fourth means;

said fourth means, when energized, being responsive to said overflow detect and said first polarity decision pulses for producing, only when said overflow detect pulse indicates presence of overflow, the fractional bits of said first overflow-free data word with polarities decided by said first polarity decision pulse;

said fifth means, when energized, being responsive to said overflow detect and said first polarity decision pulses for producing a second polarity decision pulse with a polarity decided by said first polarity decision pulse and for producing, only when said overflow detect pulse indicates presence of overflow, the integer bit of said first overflow-free data word with a polarity decided by said second polarity decision pulse;

said sixth means, when energized, being responsive to said overflow detect and said second polarity decision pulses for producing, only when said overflow detect pulse indicates presence of overflow, the sign bit of said first overflow-free data word with a polarity decided by said second polarity decision pulse.

7. A recursive digital filter as claimed in claim 6, said word format comprising the sign bit at the most significant digit, the integer bit at the most significant digit but one, and the fractional bits at the most significant digit but two through the least significant digit, said first adder, said second feedback device, and said second adder producing said first sum, said second feedback, and said second sum data words, respectively, from the least significant digits to the most significant digits, wherein said third means comprises:

delay means responsive to said second sum data word for giving a delay of one word to all bits of said second sum data word to produce a delayed sum data word comprising a delayed sign bit, a delayed integer bit, and a plurality of delayed fractional bits according to said word format, the delayed least significant digit being thus produced in a clock period next following the clock period in which said eighth means supplies said first means with the sign bits of said first sum, said second feedback, and said second sum data words and with the integer bit of said one-bit delayed data word; and eleventh means responsive to said overflow detect pulse and said delayed sum data word for producing, only when said overflow detect pulse indicates absence of overflow, said delayed fractional, integer, and sign bits as the corresponding bits of said first overflow-free data word.

8. A recursive digital filter as claimed in claim 7, said ninth means generating said first and said second timing signals to specify the clock periods for the sign and the integer bits of each of said first sum, said second feedback, and said second sum data words as the clock periods for said first and said second prescribed bits, respectively, wherein:

said overflow detect and correct circuit still further comprises a memory device comprising, in turn, a first through a fifth memory area;

said first means comprising said first memory area, said first memory area having a plurality of addresses specified, when said first means is energized, by the sign bits of said first sum, said second feedback, and said second sum data words and the integer bit of said one-bit delayed data word and memorizing prescribed combinations of binary values in the respective addresses for producing said overflow detect and said first polarity decision pulses with polarities given by the respective binary values memorized in the specified address;

said fourth means comprising said second memory area, said second memory area having a plurality of addresses specified, when said fourth means is energized, by said overflow detect and said first polarity decision pulses and memorizing prescribed combinations of binary values in the respective second memory area addresses for repeating said overflow detect and said first polarity decision pulses with polarities given by the respective binary values memorized in the specified address of said second memory area and for producing, only when said overflow detect pulse indicates presence of overflow, the fractional bits of said first overflow-free data word with polarities decided by the respective binary values memorized in the specified addresses of said second memory area;

said fifth means comprising said third memory area, said third memory area having a plurality of addresses specified, when said fifth means is energized, by said overflow detect and said first polarity decision pulses and memorizing prescribed combinations of binary values in the respective third memory area addresses for repeating said overflow detect pulse and producing said second polarity decision pulse and, only when said overflow detect pulse indicates presence of overflow, the integer bit of said first overflow-free data word with polarities given and decided by the respective binary values memorized in the specified address of said third memory area;

said sixth means comprising said fourth memory area, said fourth memory area having a plurality of addresses specified, when said sixth means is energized, by said overflow detect and said second polarity decision pulses and memorizing prescribed binary values in the respective sixth memory area addresses for producing, only when said overflow detect pulse indicates presence of overflow, the sign bit of said first overflow-free data word with a polarity decided by the binary value memorized in the specified address of said fourth memory area;

said eleventh means comprising said fifth memory area, said fifth memory area having a plurality of addresses specified by said overflow detect pulse and said delayed fractional, integer, and sign bits and memorizing prescribed binary values in the respective fifth memory area addresses for producing, only when said overflow detect pulse indicates absence of overflow, the fractional bits, the integer bit, and the sign bit of said first overflow-free data word with polarities determined by the respective binary values memorized in the fifth memory area addresses specified by the corresponding bits, respectively, of said delayed sum data word.

9. A recursive digital filter as claimed in claims 4, 5 or 8, wherein said overflow detect and correct circuit comprises a read-only memory as said memory device.

* * * * *

UNITED STATES PATENT AND TRADEMARK OFFICE
CERTIFICATE OF CORRECTION

PATENT NO. : 4,215,415
DATED : July 29, 1980
INVENTOR(S) : Akira Kanemasa and Hisashi Sakaguchi It is certified that error appears in the above-identified patent and that said Letters Patent are hereby corrected as shown below:

IN THE SPECIFICATION:

Column 3, line 44 - delete " $-1 \geq W < 1,$ " insert -- $-1 \leq W < 1,$ --

Column 6, lines 1-2 - delete " $-2 \geq U < -1$ or $1 \geq U < 2;$
$-4 < U < -2$ or $2 \geq U < 4.$ "

insert -- $-2 \leq U < -1$ or $1 \leq U < 2;$
$-4 < U < -2$ or $2 \leq U < 4.$ --

Line 25 - delete "(1)10,000," insert -- (1)10.000, --
Line 26 - delete "(0)0.1.111" insert -- (0)01.111 --

Column 9, line 63 - "ulses" insert -- pulses --
Column 10, line 7 - delete "earier" insert -- earlier --
Line 12 - delete "pularity" insert -- plurality --
Column 11, line 61 - delete "impelented" insert -- implemented --
Column 18, line 4, - after "overflow" insert -- detect --

UNITED STATES PATENT AND TRADEMARK OFFICE
CERTIFICATE OF CORRECTION

PATENT NO. : 4,215,415
DATED : July 129, 1980
INVENTOR(S) : Akira Kanemasa and Hisashi Sakaguchi It is certified that error appears in the above—identified patent and that said Letters Patent is hereby corrected as shown below:

Column 19, line 36, after "turn" delete ";" insert -- : --.

Signed and Sealed this

Eleventh Day of November 1980

[SEAL]

Attest:

SIDNEY A. DIAMOND

Attesting Officer   Commissioner of Patents and Trademarks